United States Patent
Lee et al.

(10) Patent No.: US 7,041,591 B1
(45) Date of Patent: May 9, 2006

(54) METHOD FOR FABRICATING SEMICONDUCTOR PACKAGE SUBSTRATE WITH PLATED METAL LAYER OVER CONDUCTIVE PAD

(75) Inventors: Pei-Ching Lee, Hsin-chu (TW); Xian-Zhang Wang, Hsin-chu (TW); E-Tung Chu, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 0 days.

(21) Appl. No.: 11/025,034

(22) Filed: Dec. 30, 2004

(51) Int. Cl.
*H01L 21/44* (2006.01)
*H01L 23/52* (2006.01)
*H01L 23/48* (2006.01)
*H01L 29/40* (2006.01)
*C25D 5/02* (2006.01)

(52) U.S. Cl. ............... 438/614; 438/129; 438/108; 257/779; 205/125; 205/920; 228/180.22

(58) Field of Classification Search ............ 438/108, 438/612, 614, 618, 121, 125; 257/690, 698, 257/737, 734, 738, 741, 762, 766, 778, E23.02, 257/779; 205/920, 123, 125; 228/180.21, 228/180.22, 180.5
See application file for complete search history.

(56) References Cited

U.S. PATENT DOCUMENTS

| | | | | |
|---|---|---|---|---|
| 5,981,311 A | * | 11/1999 | Chia et al. | 438/106 |
| 6,110,815 A | * | 8/2000 | Chia et al. | 438/612 |
| 6,360,434 B1 | * | 3/2002 | Newman et al. | 29/848 |
| 2003/0070931 A1 | * | 4/2003 | Kitchens | 205/118 |
| 2004/0099961 A1 | * | 5/2004 | Chu et al. | 257/781 |

* cited by examiner

*Primary Examiner*—George Eckert
*Assistant Examiner*—John M. Parker
(74) *Attorney, Agent, or Firm*—William F. Nixon; Clark & Brody

(57) ABSTRACT

A method for fabricating a semiconductor package substrate having a plated metal layer on a conductive pad is proposed. First of all, a first resist layer is formed on a semiconductor package substrate having a plurality of traces and conductive pads on a surface thereof. The first resist layer is provided with at least an opening, such that the opening is able to contact the adjacent trace. Subsequently, a conductive film is formed in the opening, such that the conductive film can electrically connect the adjacent trace and conductive pad. After removing the first resist layer, a second resist layer having a plurality of openings is formed on the surface of the substrate to expose the conductive pad. Afterwards, an electroplating process is performed on the substrate, so that a metal layer is formed on an exposed surface of the conductive pad. The second resist layer and the conductive film are then removed from the substrate. A solder mask layer having a plurality of openings is also formed on the surface of the substrate to expose the conductive pad which has been covered by the metal layer using the electroplating process.

16 Claims, 9 Drawing Sheets

METHOD FOR FABRICATING SEMICONDUCTOR PACKAGE SUBSTRATE WITH PLATED METAL LAYER OVER CONDUCTIVE PAD

FIELD OF THE INVENTION

The present invention relates to a method for fabricating a semiconductor package substrate having a plated metal layer on a conductive pad, and more particularly, to a method for fabricating a nickel/gold metal layer on an exposed surface of a conductive pad of a semiconductor package substrate by an electroplating process, such that the conductive pad with improved electrical performances can be provided for the substrate.

BACKGROUND OF THE INVENTION

Generally speaking, a plurality of traces consisted of copper materials is formed on a surface of a semiconductor package substrate and can be extended to form conductive pads which serve for signal transmission. In order to successfully electrically connect conductive elements (such as gold wires, solder bumps or solder balls) to a surface of a chip or circuit board, a metal layer such as nickel/gold (Ni/Au), nickel/silver (Ni/Ag) and the like needs to be plated on an exposed surface of the conductive pad and serves as an attachment layer between the conductive element and the conductive pad. In general, conductive pads known in the prior-art comprises a bump pad and a presolder pad for electrically connecting a flip-chip package substrate to a chip; a finger for electrically connecting a wire bonding package substrate to a chip; or a ball pad for electrically connecting a package substrate to other circuit boards. Thus, the body of the conductive pad can be prevented from being oxidized and solder joint reliability between the conductive element and the conductive pad can be improved using the nickel/gold metal layer formed on the surface of the conductive pad.

In general, prior-art methods for fabricating the nickel/gold metal layer on the conductive pad mainly comprise chemical nickel/gold fabrication, ion sputtering, plasma deposition and nickel/gold electroplating.

However, the prior-art chemical nickel/gold fabrication is inherent with significant reliability problems such as imperfect solderability and an insufficient intensity of a soldering point, for example, incomplete nickel/gold plated and a coarse nickel/gold surface. Referring to the cause of the incomplete nickel/gold plated problem, when a chemical tank is reheated after being cooled down for a while, depositing ability is insufficient to provide the full nickel/gold plated although all operating conditions are well prepared, such that gold cannot be successfully plated and copper is thus exposed. Further, referring to the cause of the coarse nickle/gold surface problem, when the surface of nickel is immersed with gold, nickel deposited underneath is continuously oxidized and aged by an enhanced effect of a chemical potential because of over oxidization of the surface of nickel, irregular deposition of large-sized gold atoms and porosity of rough gold crystals, such that nickel rust which is not melted away is continuously accumulated beneath the surface of gold. Thus result in a coarse nickel/gold surface. The foregoing incomplete nickel/gold plated and coarse nickel/gold surface problems caused by the chemical nickel/gold fabrication might easily result in detaching the gold wire, solder bump, presolder and solder ball from the conductive pad, so as not to provide a good electrical connection. Additionally, the costs of ion sputtering and plasma deposition are too high to comply with the economic efficiency.

Therefore, an electroplating process is commonly employed to form the nickel/gold metal layer on the conductive pad. Referring to FIG. 1, the prior-art fabrication of the nickel/gold metal layer using an electroplating process relates to define a plurality of conductive pads 14 (such as fingers and ball pads) on a substrate 1 by developing and etching techniques, wherein the substrate 1 has been previously subject to former fabrication including circuit patterning of upper and lower circuit layers 11 and 12 and formation of a plurality of plated through holes 13 penetrating through the substrate 1. Further, a solder mask layer 15 is also formed on an outer surface of the substrate 1.

Referring to FIG. 1, the structure of a nickel/gold metal layer 16 is formed on the conductive pad 14 by an electroplating process. However, in order to form such structure, a plurality of plating traces 17 connected to original traces has to be additionally provided on the substrate 1 to electroplate the nickel/gold metal layer 16 on the conductive pad 14. Thus, although the nickel/gold metal layer 16 can be formed on the conductive pad 14, a plurality of plating traces also needs to be provided to perform the electroplating process. Consequently, not only areas of the substrate 1 free of arranging circuits are occupied but also an antenna effect might be caused by extra plating traces to therefore result in noises during the high frequency use. If an etchback method is employed to remove the plating traces 17, an end portion of the plating trace will still be remained. Thus, although the nickel/gold metal layer can be formed on the conductive pad 14, an irregular structure caused by the end portion of the plating trace will be existed. Problems such as limited areas of the substrate for circuit arrangement and noise interruption during the high frequency use are existed. Additionally, as the nickel/gold metal layer is also formed on a surface of the plating trace 17 while forming the nickel/gold metal layer 16 on the conductive pad 14, and a number of etchback processes have to be subsequently performed to remove the plating trace 17 which has no functions, the substrate is seriously scraped and damaged. Moreover, referring to the conditions of complexity of circuit arrangement of the substrate and high density conductive pads, the remained area of the substrate is insufficient for arranging additional plating traces, therefore increasing the difficulty in fabricating the nickel/gold layer using an electroplating process.

Another electroplating process widely employed by manufacturers is "gold pattern plating (GPP)". Referring to FIG. 2A to FIG. 2D, first of all, a conductive layer 21 (as shown in FIG. 2A) is respectively formed on upper and lower surfaces of a substrate 2. Then, a plurality of plated through holes (PTH) or blind vias (not shown) are formed penetrating through the substrate 2 to electrically connect the conductive layers 21 formed on the upper and lower surfaces of the substrate 2.

Referring to FIG. 2B, a photoresist layer 22 is formed on the conductive layer 21 of the substrate 2. The photoresist layer 22 is provided with a plurality of openings to expose the conductive layer 21 for subsequently forming circuit areas. The conductive layer 21 serves as a current conductive path, such that a nickel/gold metal layer 23 is formed on a surface of the conductive layer 21 free of being covered by the photoresist layer 22 using an electroplating process.

Referring to FIG. 2C, the photoresist layer 22 is removed. Then, the nickel/gold metal layer 23 is used as a mask resist layer, and the conductive layer 21 underneath the nickel/gold metal layer 23 is patterned using an etching technique.

Therefore, referring to FIG. 2D, the nickel/gold metal layer 23 is covered on a surface of a circuit pattern 21a formed by etching the conductive layer 21.

Instead of the plated traces, the foregoing gold pattern plating (GPP) technique employs the conductive layer to serve as the current conductive path for electroplating the nickel/gold metal layer. However, as the whole circuit layer of the substrate (comprising the conductive pad and all traces) is formed with the nickel/gold metal layer on a surface thereof, the material cost is extremely high. Also, during a subsequent circuit pattering process, the solder mask layer and the nickel/gold metal layer cannot easily be adhesive to each other due to a difference between these two materials, so as not to achieve a stable structure.

Therefore, the problem to be solved here is to provide a method for fabricating a semiconductor package substrate having a plated metal layer on a conductive pad, by which fabrication procedures can be simplified and a fabrication cost can be minimized to solve problems such as incomplete nickel/gold plated and a course nickel/gold surface caused by the prior-art chemical nickel/gold fabrication while eliminating drawbacks such as imperfect reliability and wasting of costs caused by the prior-art fabrication of the nickel/gold metal layer using an electroplating process.

SUMMARY OF THE INVENTION

In light of the above prior-art drawbacks, a primary objective of the present invention is to provide a method for fabricating a semiconductor package substrate having a plated metal layer on a conductive pad, by which a metal layer such as a nickel/gold metal layer is formed on an exposed surface of the conductive pad using an electroplating process. Therefore, electrical connection between gold wires, solder bumps or solder balls and chips or circuit boards can be improved, and the nickel/gold metal layer can prevent a body of the conductive pad from being easily oxidized due to an environmental factor.

Another objective of the present invention is to provide a method for fabricating a semiconductor package substrate having a plated metal layer on a conductive pad, by which problems such as incomplete nickel/gold plated and a course nickel/gold surface caused by prior-art chemical nickel/gold fabrication can be solved, so as to effectively improve reliability of a packaging structure.

Still another objective of the present invention is to provide a method for fabricating a semiconductor package substrate having a plated metal layer on a conductive pad, by which additional plating traces are not required on a surface of the package substrate, so as to dramatically increase effective areas of the substrate for circuit arrangement and eliminate noise interruption caused by the presence of the plating trace.

A further objective of the present invention is to provide a method for fabricating a semiconductor package substrate having a plated metal layer on a conductive pad, by which a drawback that a nickel/gold metal layer has to be formed to cover a whole circuit layer of the package substrate in the prior-art fabrication can be eliminated. Thus, the required nickel/gold metal layer is only formed on the conductive pad to effectively minimize a fabrication cost of electroplating the nickel/gold metal layer.

A further objective of the present invention is to provide a method for fabricating a semiconductor package substrate having a plated metal layer on a conductive pad, by which the density of circuits arranged on the substrate can be increased.

In accordance with the above and other objectives, the present invention proposes a method for fabricating a semiconductor package substrate having a plated metal layer on a conductive pad. First of all, a semiconductor package substrate having a plurality of traces and conductive pads on at least a surface thereof is provided. Then, a first resist layer is formed on the surface of the substrate. At least an opening is formed penetrating through the first resist layer and contacts to the adjacent trace. Subsequently, a conductive film is formed in the opening, such that the adjacent trace and conductive pad are electrically connected by the means of the conductive film. After removing the first resist layer, a second resist layer having a plurality of openings is formed on the surface of the substrate to expose the conductive pad. Afterwards, an electroplating process is performed, such that a metal layer such as a nickel/gold metal layer is formed on an exposed surface of the conductive pad. The second resist layer and the conductive film are successively removed. A solder mask layer having a plurality of openings is then formed on the surface of the substrate, such that the conductive pad being formed with the plated metal layer is exposed. The size of the opening penetrating through the solder mask layer can be larger or smaller than that of the conductive pad.

Referring to the method for fabricating the semiconductor package substrate having the plated metal layer on the conductive pad proposed in the present invention, a nickel/gold metal layer is formed on the exposed surface of the conductive pad to effectively electrically connect gold wires, solder bumps or solder balls to chips or circuit boards while preventing a body of the conductive pad from being easily oxidized due to an environmental factor. Furthermore, problems such as incomplete nickel/gold plated and a course nickel/gold surface caused by prior-art chemical nickel/gold fabrication can be solved, so as to effectively improve reliability of a packaging structure. Plating traces are not additionally required on a surface of the package substrate, so as to dramatically increase effective areas of the substrate for circuit arrangement and eliminate noise interruption caused by the presence of the plating traces. Additionally, the drawback that a nickel/gold metal layer has to be formed to cover a whole circuit layer of the package substrate in the prior-art fabrication can be eliminated, so as to effectively minimize a fabrication cost of electroplating the nickel/gold metal layer.

The following embodiment only serves to provide further description for the present invention with no intent to limit the scope of the invention. More particularly, the plated metal layer on the conductive pad proposed in the present invention can be widely applied to general package substrates. Thus, a flip-chip package substrate is used in figures to illustrate the present invention with no intent to limit the scope of the invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
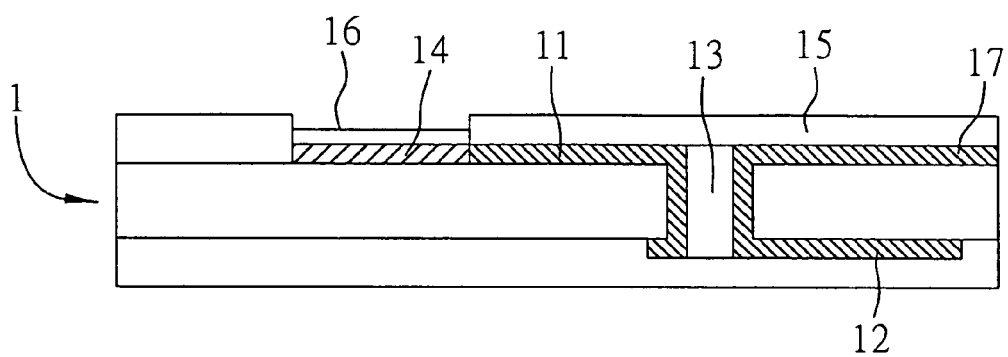
FIG. 1 is a cross-sectional view of fabricating a plated nickel/gold metal layer on a conductive pad of a semiconductor package substrate using plating traces according to prior-art.
Figure 2A:
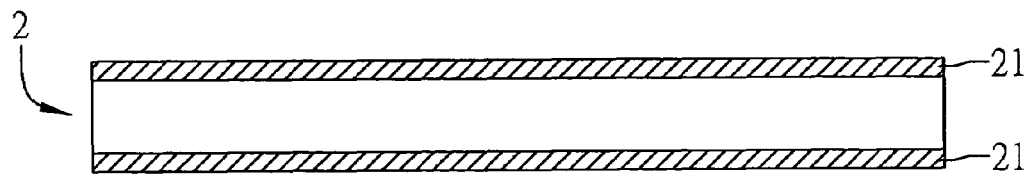
FIG. 2A to FIG. 2D are cross-sectional views showing a method for fabricating a plated nickel/gold metal layer on a conductive pad of a semiconductor package substrate using a gold pattern plating (GPP) technique according to prior-art.
Figure 2B:
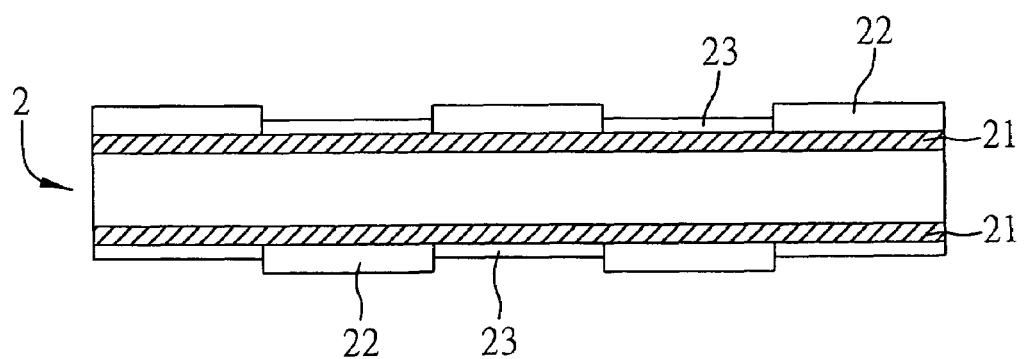
Figure 2C:
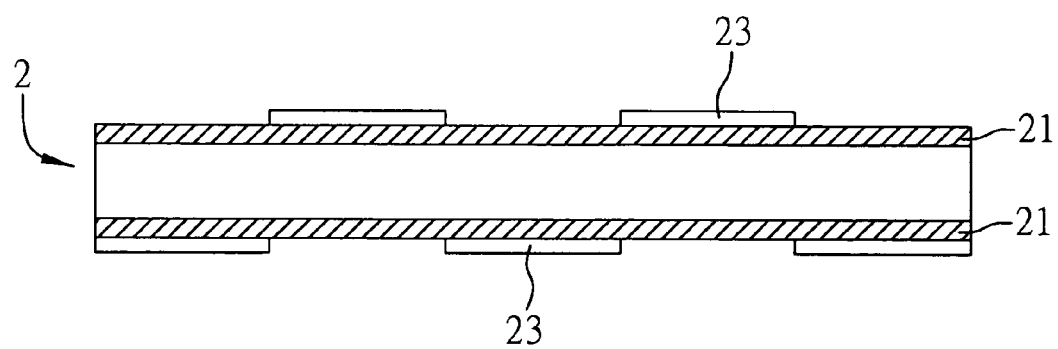
Figure 2D:
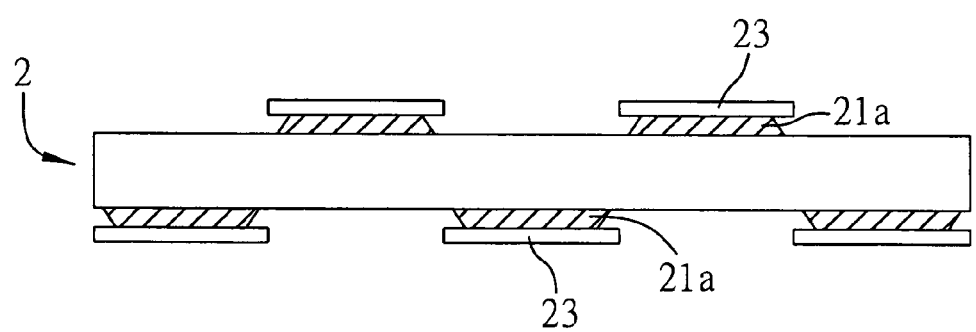
Figure 3:
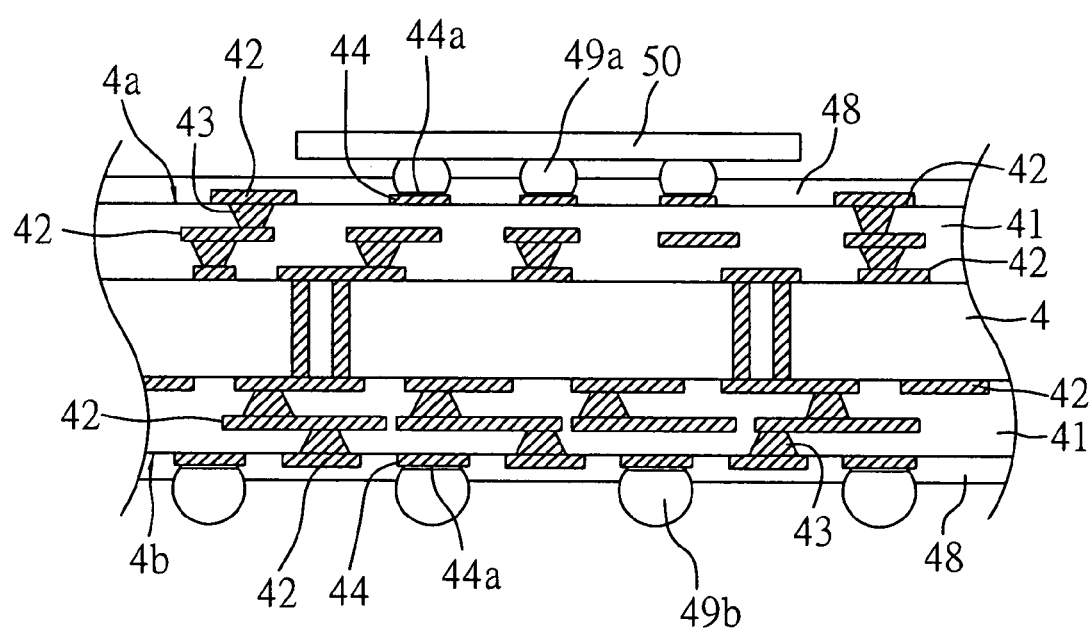
FIG. 3 is a cross-sectional view showing a semiconductor package substrate having a plated metal layer formed on a conductive pad according to the present invention.

FIG. 3 is a cross-sectional view showing a semiconductor package substrate having a plated metal layer formed on a conductive pad according to the present invention.

Referring to FIG. 3, a substrate 4 which is a flip-chip ball grid array (FCBGA) package substrate comprises a plurality of insulating layers 41, conductive circuit layers 42 crossly superimposed with the insulating layer 41, vias 43 penetrating through the insulating layer 41 for electrically connecting the circuit layer 42, and a solder mask layer 48 for covering and protecting a surface of the substrate 4.

The insulating layer 41 of the substrate 4 can be selected from the group consisting of organic materials, fiber-reinforced organic materials or particle-reinforced organic materials such as epoxy resins, polyimide, bismaleimide triazine-based resins, cyanate esters and the like. Referring to fabrication of the circuit layer 42, a conductive metal layer such as a copper layer is firstly formed on the insulating layer 41. Then, a patterned circuit layer 42 is formed using an etching technique. Further, the circuit layer 42 can also be fabricated by forming fine circuits in a patterned resist layer using an electroplating process. The circuit layers 42 formed on a first surface 4a and a second surface 4b of the substrate 4 are provided with a plurality of conductive pads 44. For example, the conductive pad 44 on the first surface 4a can be a bump pad or a presolder pad. Thus, a flip-chip semiconductor chip 50 can be electrically connect to the conductive pad 44 on the first surface 4a by the means of a plurality of solder bumps 49a formed on the chip. The conductive pad 44 formed on the second surface 4b can be ball pads for mounting a plurality of solder balls 49b, such that the semiconductor chip 50 which has been completely packaged using a flip-chip method can be electrically connected to an external device (not shown). For example, solder joints can be used to electrically connect a circuit board.

The circuit layer 42 and the conductive pad 44 are made of general metal copper. In order to prevent the conductive pad 44 on the first surface 4a and the second surface 4b from being oxidized due to an environmental factor, or to effectively connect the solder bump 49a or the solder ball 49b, a metal barrier 44a serving as a metal resist layer is formed on an exposed surface of the conductive pad 44 by an electroplating process. A general metal barrier comprises a nickel adhesive layer and a gold passivation layer formed on the conductive pad 44. However, the barrier can also be selected from the group consisting of gold, nickel, palladium, silver, tin, nickel/palladium, chromium/titanium, palladium/gold or nickel/palladium/gold deposited by techniques such as electroplating, electroless-plating or physical vapor deposition. Subsequently, a solder mask layer 48 is formed to cover the surface of the substrate 4. The solder mask layer 48 is provided with a plurality of openings to expose the conductive pad, wherein at least a conductive pad 44 is not attached to any plating trace.

FIG. 4A to FIG. 4I are schematic diagrams showing a method for fabricating a semiconductor package substrate having a plated metal layer on a conductive pad according to the present invention.

Figure 4A:
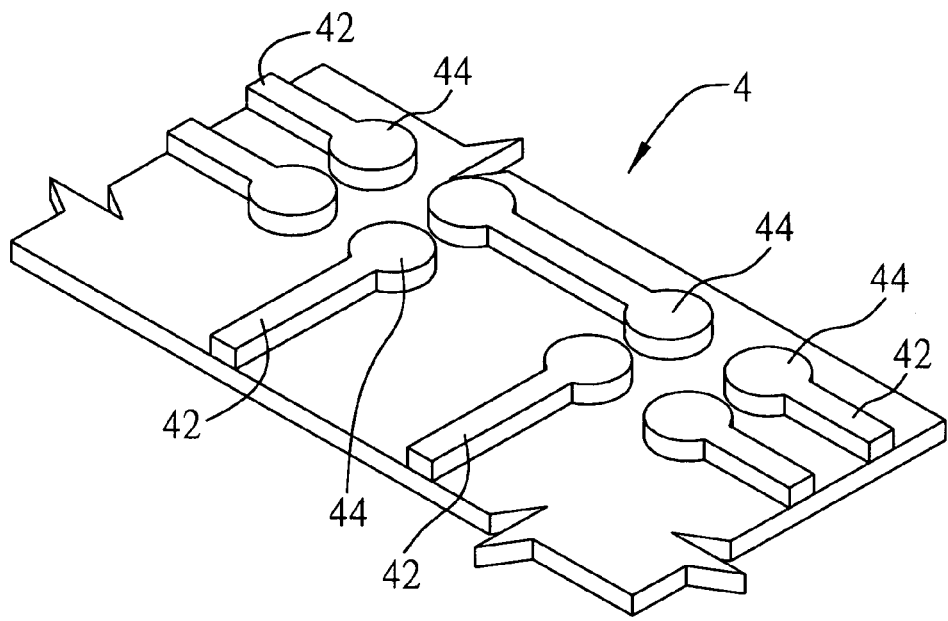
FIG. 4A to FIG. 4I are schematic diagrams showing a method for fabricating a semiconductor package substrate having a plated metal layer on a conductive pad according to the present invention.

Referring to FIG. 4A, first of all, a package substrate 4 is provided. The substrate can be a flip-chip package substrate as shown in FIG. 3, or alternatively, it can be a general wire bonding package substrate. The substrate 4 has been previously subject to former fabrication including formation of a plurality of plated through holes (PTH) or conductive vias (not shown) penetrating through the substrate 4 and patterned traces 42 formed on a surface of the substrate 4. The patterned trace 42 is provided with a conductive pad 44. The patterning process is very complex and well known by manufacturers. Also, it is not a technical feature of the present invention, and therefore is not further described.

Figure 4B:
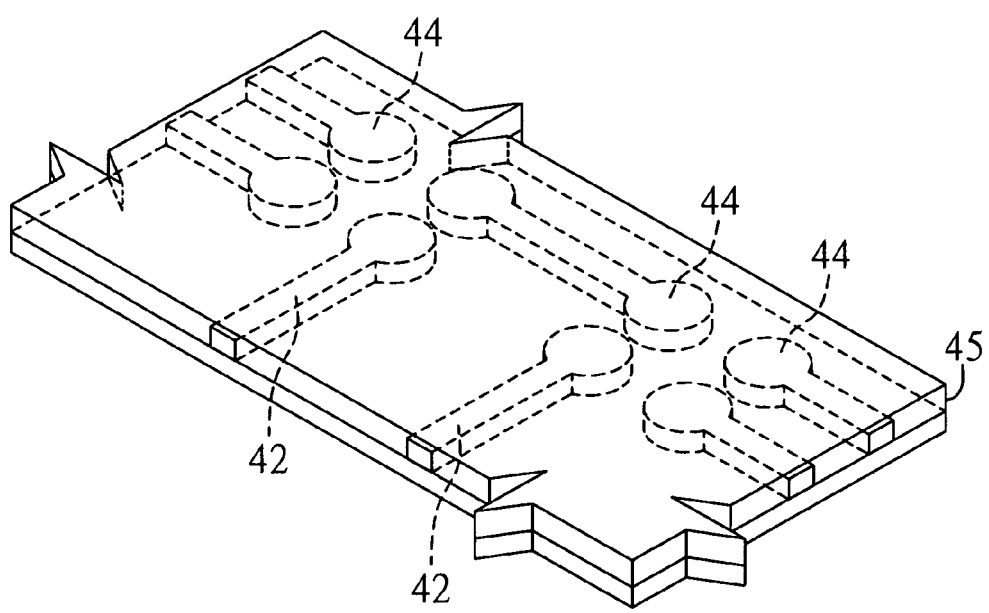

Referring to FIG. 4B, a first resist layer 45 is formed on the surface of the substrate 4 using printing, pin-coating or attaching techniques. The first resist layer 45 can be one of dry film, photo resist layer and tape, etc.

Figure 4C:
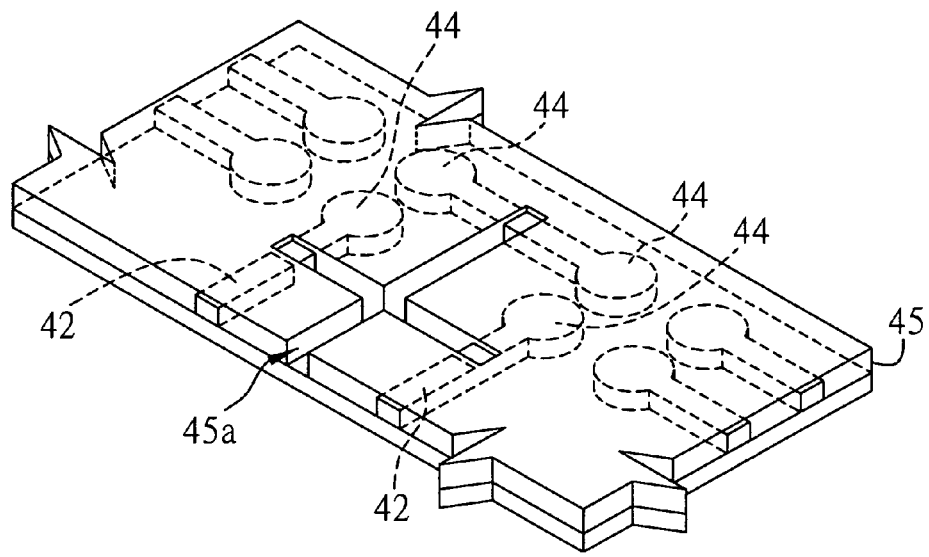

Referring to FIG. 4C, at least an opening 45a is formed penetrating through the first resist layer 45 by laser burning or exposing-developing techniques. The opening 45a can contact to the adjacent traces 42.

Figure 4D:
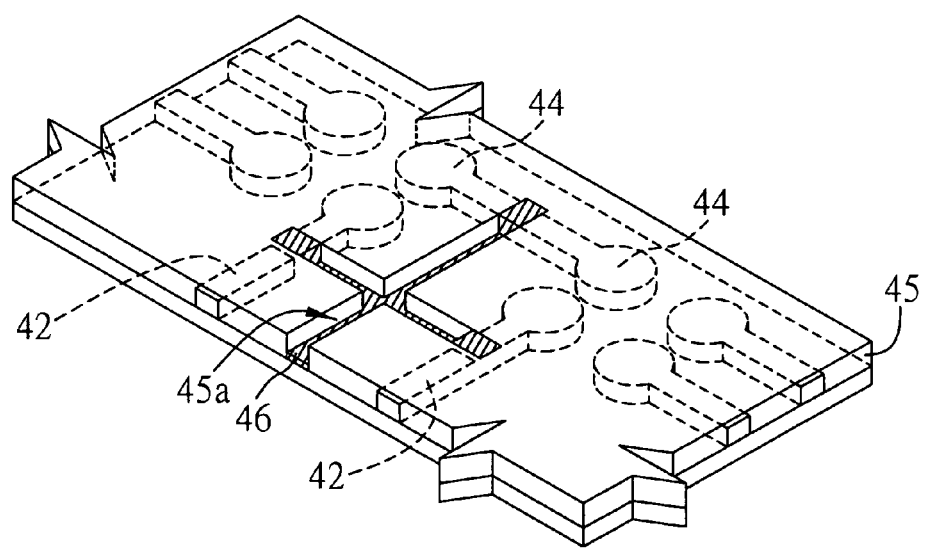

Referring to FIG. 4D, a conductive film 46 is formed in the opening 45a of the first resist layer, such that the conductive film 46 can be electrically connected to the adjacent traces 42 and conductive pads 44. The conductive film 46 serves as a current conductive path for subsequently forming a plated metal layer 44a. The conductive film 46 can be made of a metal, an alloy, or several deposited metal layers, such as copper (Cu), tin (Sn), nickel (Ni), chromium (Cr), titanium (Ti), copper/chromium (Cu/Cr) alloy or tin/lead (Sn/Pb) alloy. The conductive film 46 can be formed in the opening 45a of the first resist layer on the substrate by the physical vapor deposition (PVD), chemical vapor deposition (CVD), electroless plating or chemical deposition technique, such as sputtering, evaporation, arc vapor deposition, ion beam sputtering, laser ablation deposition, plasma enhanced chemical vapor deposition (PECVD), or organic metal chemical vapor deposition (OMCVD). Preferably the conductive film 46 is made of copper (Cu) or palladium (Pd) particles (particularly electroless-plated).

Figure 4E:
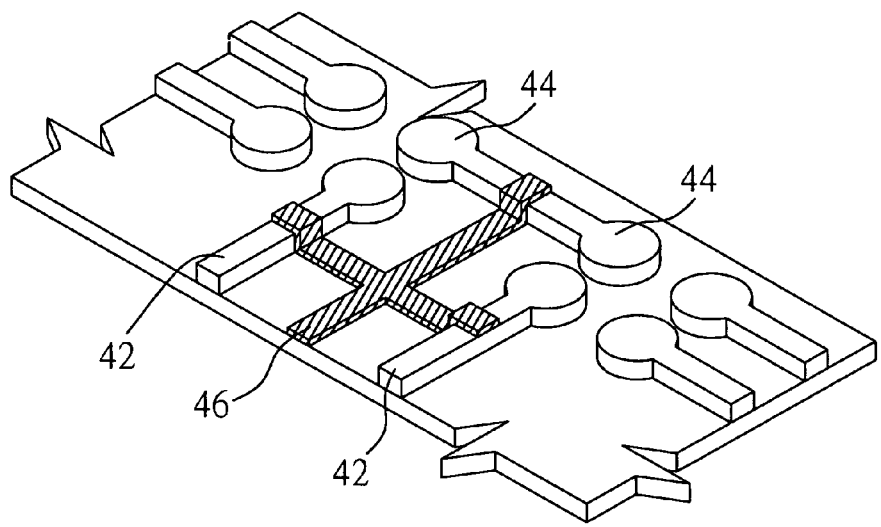

Referring to FIG. 4E, the first resist layer 45 formed on the surface of the substrate is removed using a chemical method (such as an etching technique), a physical method such as peeling off or a laser technique, such that the conductive film 46 which serves as the current conductive path required for subsequently forming the plated metal layer on the conductive pad is exposed on the substrate.

Figure 4F:
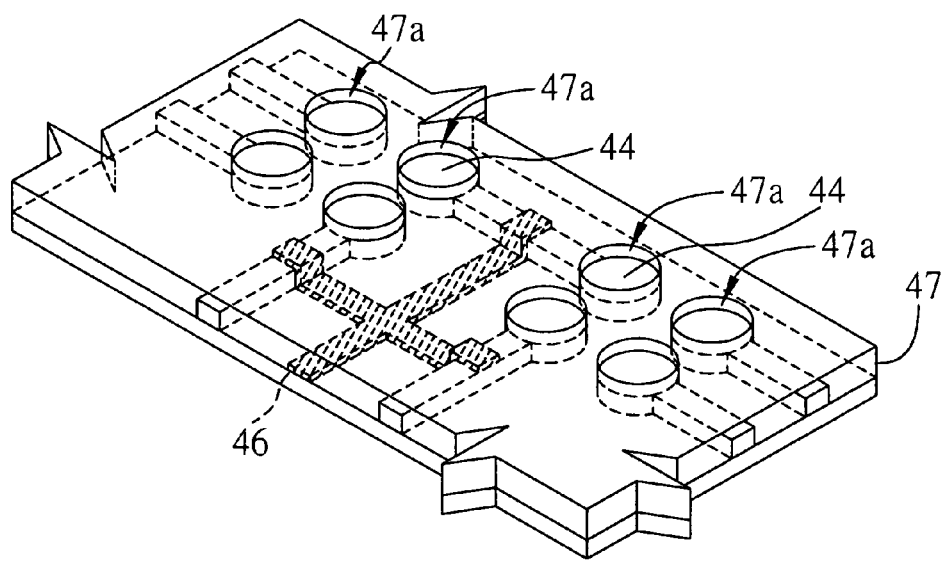

Referring to FIG. 4F, a second resist layer 47 is formed on the substrate by printing, spin-coating or attaching techniques. The second resist layer 47 is provided with a plurality of openings 47a to expose the conductive pad 44.

Figure 4G:
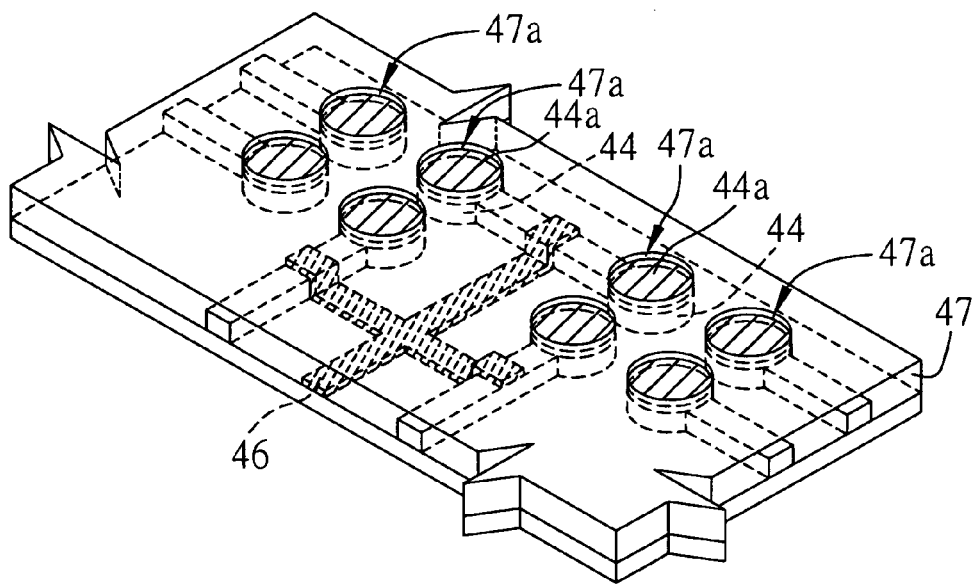

Referring to FIG. 4G, a metal layer is then formed on the package substrate 4 using an electroplating process. The plated metal layer can be selected from the group consisting of gold, nickel, palladium, silver, tin, nickel/palladium, chromium/titanium, nickel/gold, palladium/gold or nickel/palladium/gold. The conductive film 46 can serve as the current conductive path for electroplating the metal layer, preferably a nickel/gold metal layer, due to its conductive characteristic. First of all, a nickel layer is formed by an electroplating process. A gold layer is then formed on the nickel layer using an electroplating process. Thus, the nickel/gold metal can be formed on an exposed surface of the conductive pad 44 by the electroplating processes, such that a plated metal layer 44a is formed on the exposed surface of the conductive pad 44. The selection of metal materials to be plated of the present invention can be the foregoing nickel and gold metals or other metals. For example, gold can be directly formed on the exposed surface of the conductive pad 44. Thus, the present invention may be modified based on different views and applications without departing from the spirit of the invention.

Figure 4H:
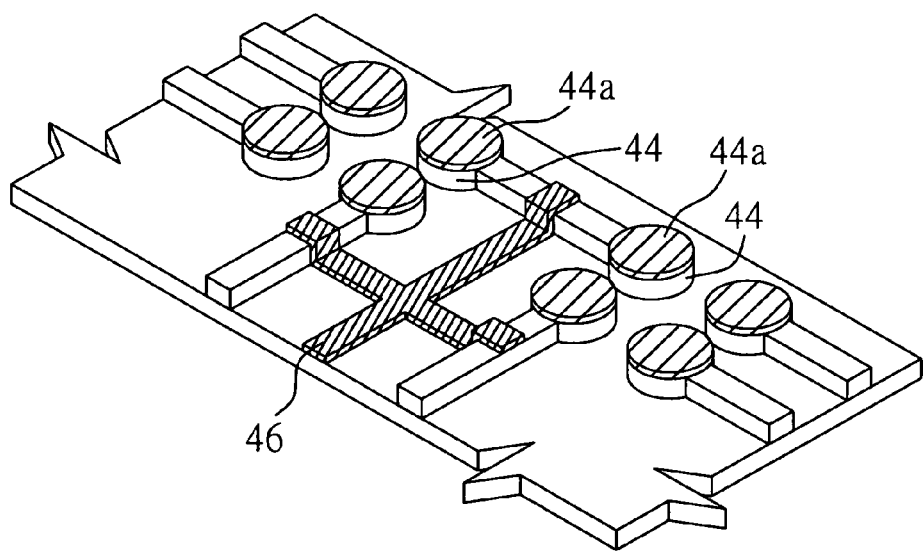

Referring to FIG. 4H, after forming the nickel/gold metal layer 44a on the exposed surface of the conductive pad 44, the second resist layer 47 is removed. Subsequently, the conductive film 46 serving as the current conductive path for the electroplating process is removed using dry etching or wet etching techniques. Thus, the fabrication of the plated metal layer 44a covered on the conductive pad 44 has been completed.

Figure 4I:
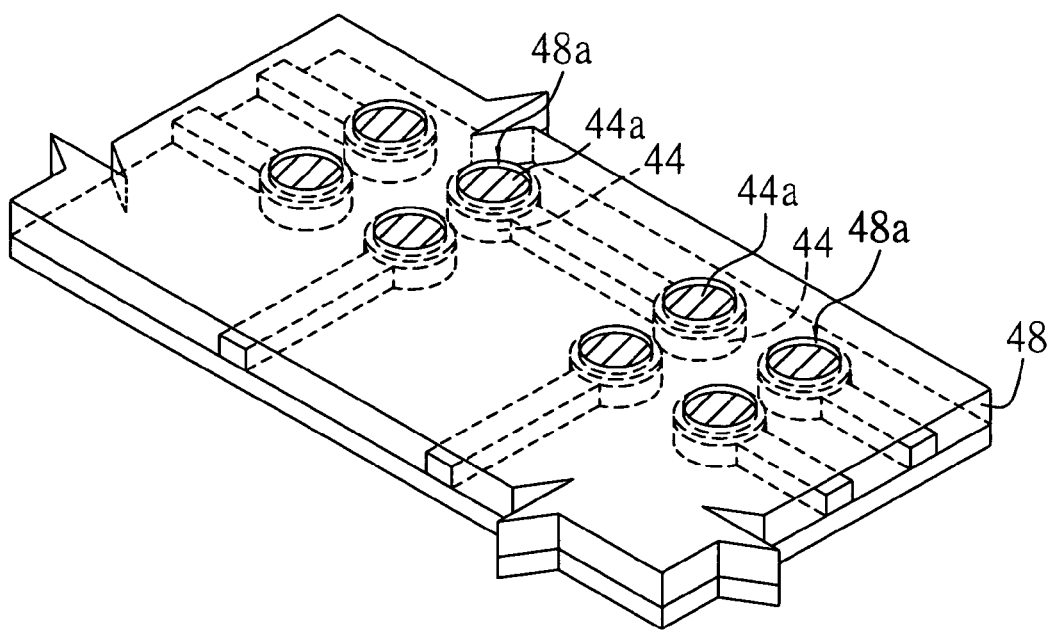

Referring to FIG. 4I, a solder mask layer 48 such as green paints is then formed on the surface of the package substrate 4, such that the substrate 4 is protected from being damaged by environmental contaminations. Further, the solder mask layer 48 is provided with a plurality of openings 48a, such that the conductive pad 44 formed with the plated metal layer 44a can be exposed. The size of the opening 48a formed penetrating through the solder mask layer 48 is smaller than that of the conductive pad 44, such that a solder mask defined (SMD) conductive pad can be formed. Alternatively, the size of the opening 48a formed penetrating through the solder mask layer 48 can be larger than that of the conductive pad 44, such that a non-solder mask defined (NSMD) conductive pad can be formed. Moreover, the conductive pad 44 covered by the plated metal layer 44a can serve as an interface for electrically connecting a chip or circuit board.

Referring to the method for fabricating the semiconductor package substrate having the plated metal layer on the conductive pad proposed in the present invention, a nickel/gold metal layer is formed on the exposed surface of the conductive pad to effectively electrically connect gold wires, solder bumps or solder balls to chips or circuit boards while preventing a body of the conductive pad from being easily oxidized due to an environmental factor. Furthermore, problems such as incomplete nickel/gold plated and a course nickel/gold surface caused by prior-art chemical nickel/gold fabrication can be solved, so as to effectively improve reliability of a packaging structure. Plating traces are not additionally required on a surface of the package substrate, so as to dramatically increase effective areas of the substrate for circuit arrangement and eliminate noise interruption caused by the presence of the plated trace. Additionally, the drawback that a nickel/gold metal layer has to be formed to cover a whole circuit layer of the package substrate in the prior-art fabrication can be eliminated, so as to effectively minimize a fabrication cost of electroplating the nickel/gold metal layer.

The conductive pad described in the method for fabricating the semiconductor package substrate having the plated metal layer on the conductive pad proposed in the present invention can comprise fingers, bump pads, presolder pads or ball pads of a package substrate. Only some conductive pads are shown in figures to illustrate the present invention. Actually, the amount of the conductive pad, the current conductive path for the electroplating process and the resist layer for providing a mask effect can all be redesigned and rearranged on the surface of the substrate depending on the practical requirements. Furthermore, the fabrication can be applied to single or double surfaces of the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package substrate having a plated metal layer on a conductive pad, comprising steps of:

providing a semiconductor package substrate having a plurality of traces and conductive pads connected thereto formed on at least a surface thereof;

forming a first resist layer to cover the surface of the substrate and forming at least an opening penetrating through the first resist layer, such that the opening contacts traces adjacent to said opening;

forming a conductive film in the opening of the first resist layer, such that the conductive film electrically connects the adjacent traces;

removing the first resist layer and forming a second resist layer covering the surface of the substrate including pads and traces and having a plurality of openings on the surface to expose the conductive pads;

performing an electroplating process on the substrate, such that a metal layer is formed on an exposed surface of the conductive pads; and removing the second resist layer and the conductive film from the substrate.

2. The method for fabricating a semiconductor package substrate having a plated metal layer on a conductive pad of claim 1, further comprising a step of:

forming a solder mask layer having a plurality of openings on the surface of the package substrate, such that the conductive pad which has been formed with the plated metal layer is exposed.

3. The method for fabricating a semiconductor package substrate having a plated metal layer on a conductive pad of claim 2, wherein a size of the opening formed penetrating through the solder mask layer can be larger than that of the conductive pad.

4. The method for fabricating a semiconductor package substrate having a plated metal layer on a conductive pad of claim 2, wherein a size of the opening formed penetrating through the solder mask layer can be smaller than that of the conductive pad.

5. The method for fabricating a semiconductor package substrate having a plated metal layer on a conductive pad of claim 2, wherein the solder mask layer can be a green paint.

6. The method for fabricating a semiconductor package substrate having a plated metal layer on a conductive pad of claim 1, wherein the package substrate is a flip-chip package substrate.

7. The method for fabricating a semiconductor package substrate having a plated metal layer on a conductive pad of claim 1, wherein the package substrate is a wire bonding package substrate.

8. The method for fabricating a semiconductor package substrate having a plated metal layer on a conductive pad of claim 1, wherein the conductive pad can be a bump pad.

9. The method for fabricating a semiconductor package substrate having a plated metal layer on a conductive pad of claim 1, wherein the conductive pad can be a ball pad.

10. The method for fabricating a semiconductor package substrate having a plated metal layer on a conductive pad of claim 1, wherein the conductive pad can be a finger.

11. The method for fabricating a semiconductor package substrate having a plated metal layer on a conductive pad of claim 1, wherein the plated metal layer can be selected from the group consisting of gold, nickel, palladium, silver, tin, nickel/palladium, chromium/titanium, nickel/gold, palladium/gold and nickel/palladium/gold.

12. The method for fabricating a semiconductor package substrate having a plated metal layer on a conductive pad of claim 1, wherein the conductive film can be selected from the group consisting of copper, tin, nickel, chromium, titanium, copper-chromium alloy and tin-lead alloy.

13. The method for fabricating a semiconductor package substrate having a plated metal layer on a conductive pad of claim 1, wherein the conductive film can be formed by techniques selected from the groups consisting of sputtering, electroless plating and physical or chemical deposition.

14. The method for fabricating a semiconductor package substrate having a plated metal layer on a conductive pad of claim 1, wherein the first resist layer is selected from one of dry film, photo resist layer, and tape.

15. The method for fabricating a semiconductor package substrate having a plated metal layer on a conductive pad of claim 1, wherein the first resist layer can form at least an opening by laser or exposing-developing techniques.

16. The method for fabricating a semiconductor package substrate having a plated metal layer on a conductive pad of claim 1, wherein the conductive film can be removed from the surface of the substrate by an etching technique.

* * * * *